United States Patent
Xu et al.

(10) Patent No.: US 9,083,588 B1
(45) Date of Patent: Jul. 14, 2015

(54) POLAR RECEIVER WITH ADJUSTABLE DELAY AND SIGNAL PROCESSING METHO

(71) Applicant: Innophase Inc., Chicago, IL (US)

(72) Inventors: Yang Xu, Chicago, IL (US); Sara Munoz Hermoso, Chicago, IL (US)

(73) Assignee: INNOPHASE, INC., Chicago, IL (US)

( * ) Notice: Subject to any disclaimer, the term of this patent is extended or adjusted under 35 U.S.C. 154(b) by 0 days.

(21) Appl. No.: 14/260,021

(22) Filed: Apr. 23, 2014

(51) Int. Cl.
*H04L 25/00* (2006.01)
*H04L 27/227* (2006.01)

(52) U.S. Cl.
CPC .......... *H04L 27/227* (2013.01); *H04L 27/2272* (2013.01)

(58) Field of Classification Search
CPC . H04L 27/227; H04L 27/233; H04L 27/2332; H04L 27/2272; H04L 27/2273; H04L 7/033; H04L 7/0337; H03L 7/0814
USPC ......... 375/324–325, 346, 348, 350, 371, 373, 375/376
See application file for complete search history.

(56) References Cited

U.S. PATENT DOCUMENTS

| | | | |
|---|---|---|---|
| 6,369,659 B1 | 4/2002 | Delzer et al. | |
| 6,556,636 B1 | 4/2003 | Takagi | |
| 6,975,165 B2 | 12/2005 | Lopez Villegas et al. | |
| 7,095,274 B2 | 8/2006 | Lopez Villegas et al. | |
| 7,564,929 B2 | 7/2009 | Lopez Villegas et al. | |
| 8,498,601 B2 | 7/2013 | Horng et al. | |
| 8,542,779 B2 * | 9/2013 | Xu | 375/327 |
| 8,804,875 B1 * | 8/2014 | Xu et al. | 375/327 |
| 2004/0036538 A1 | 2/2004 | Devries et al. | |
| 2008/0150645 A1 | 6/2008 | McCorquodale et al. | |
| 2011/0050296 A1 | 3/2011 | Fagg | |
| 2012/0074990 A1 | 3/2012 | Sornin | |
| 2012/0207195 A1 * | 8/2012 | Kawasaki et al. | 375/219 |
| 2012/0256693 A1 | 10/2012 | Raghunathan et al. | |
| 2012/0306547 A1 | 12/2012 | Arora | |
| 2013/0143509 A1 * | 6/2013 | Horng et al. | 455/269 |

FOREIGN PATENT DOCUMENTS

WO 2012132847 10/2012

OTHER PUBLICATIONS

Jose Maria Lopez-Villegas et al., BPSK to ASK Signal Conversion Using Injection-Locked Oscillators-Part I: Theory, Dec. 2005, IEEE Transactions on Microwave Theory and Techniques, vol. 53, No. 12, available online at: http://diposit.ub.edu/dspace/bitstream/2445/8751/1/529612.pdf.
International Search Report for PCT/US2013/024159 mailed Apr. 9, 2013.

(Continued)

*Primary Examiner* — Khanh C Tran
(74) *Attorney, Agent, or Firm* — Invention Mine LLC

(57) ABSTRACT

Adjusting a relative phase within a polar receiver to reduce a DC error, the polar receiver having (i) a harmonic ILO having an RF modulated signal input and a phase-compressed divided-frequency output, (ii) a fundamental ILO connected to the phase-compressed divided-frequency output and having a phase-locking output, (iii) a delay element, and (iv) a phase discriminator connected to the delay element output and to the phase-locking output, and having a phase-detection output representative of a phase difference between signals on the delay output and the phase-locking output.

20 Claims, 7 Drawing Sheets

(56) References Cited

OTHER PUBLICATIONS

Chi-Tsan Chen, Cognitive Polar Receiver Using Two Injection-Locked Oscillator Stages, IEEE Transactions on Microwave Theory and Techniques, vol. 59, No. 12, Dec. 2011.

N. Siripon, et al., Novel Sub-Harmonic Injection-Locked Balanced Oscillator, Microwave and Systems Research Group (MSRG), School of Electronics, Computing and Mathematics, University of Surrey, Sep. 24, 2011, 31st European Microwave Conference.

Hamid R Rategh, et al., Superharmonic Injection Locked Oscillators as Low Power Frequency Dividers, Stanford University, Stanford, California, 1998 IEEE.

Behzad Razavi, A Study of Injection Pulling and Locking in Oscillators, Electrical Engineering Department, University of California, 2003, IEEE, Custom Integrated Circuits Conference.

Marc Tiebout, A 50GHz Direct Injection Locked Oscillator Topology as Low Power Frequency Divider in 0.13 µm CMOS, Infineon Technologies AG, Solid-State Circuits Conference, 2003, pp. 73-76, 29th European ESSCIRC.

Pei-Kang Tsai, et al., Wideband Injection-Locked Divide-by-3 Frequency Divider Design with Regenerative Second-Harmonic Feedback Technique, RF@CAD Laboratory, Department of Electrical Engineering, National Cheng Kung University, Tainan, Taiwan, Oct. 2012.

Chi-Tsan Chen et al., Wireless Polar Receiver Using Two Injection-Locked Oscillator Stages for Green Radios, IEEE MTT-S International, Jun. 2011.

International Search Report and Written Opinion for PCT/US2014/030525 mailed Jul. 24, 2014.

AEROFLEX, Application Note, Measurement of Frequency Stability and Phase Noise, Feb. 2007, part No. 46891/865.

Hewlett Packard, Phase Noise Characterization of Microwave Oscillators, Frequency Discriminator Method, Sep. 1985, USA.

Claude Frantz, Frequency Discriminator, published 1994.

Electronic Warfare and Radar Systems Engineering Handbook, Mixers and Frequency Discriminators, Section 6-8.1 to 6-8.2, Apr. 1, 1999, Naval Air Systems Command and Naval Air Warfare Center, USA.

International Search Report and Written Opinion for PCT/US2014/029055 mailed Sep. 15, 2014.

* cited by examiner

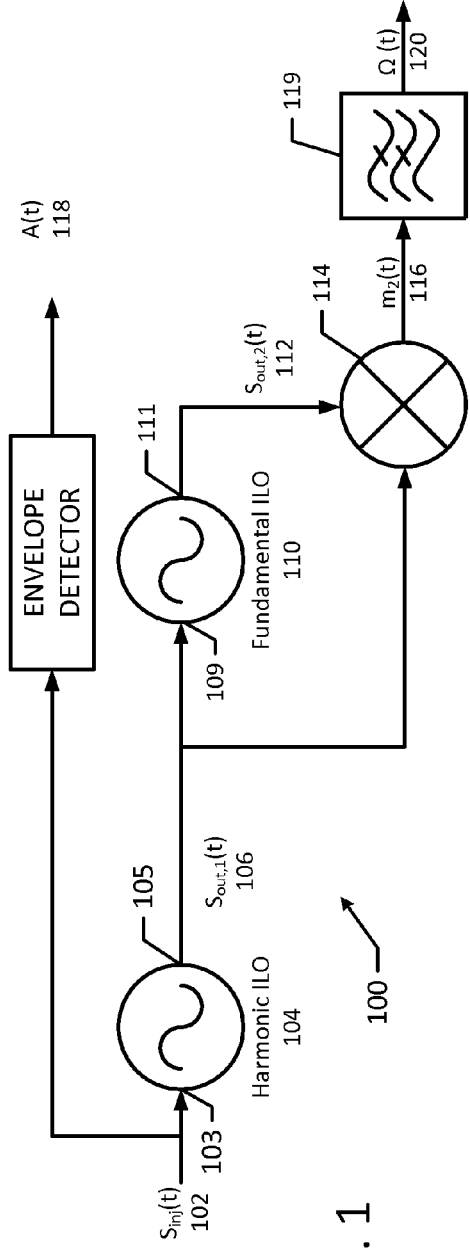
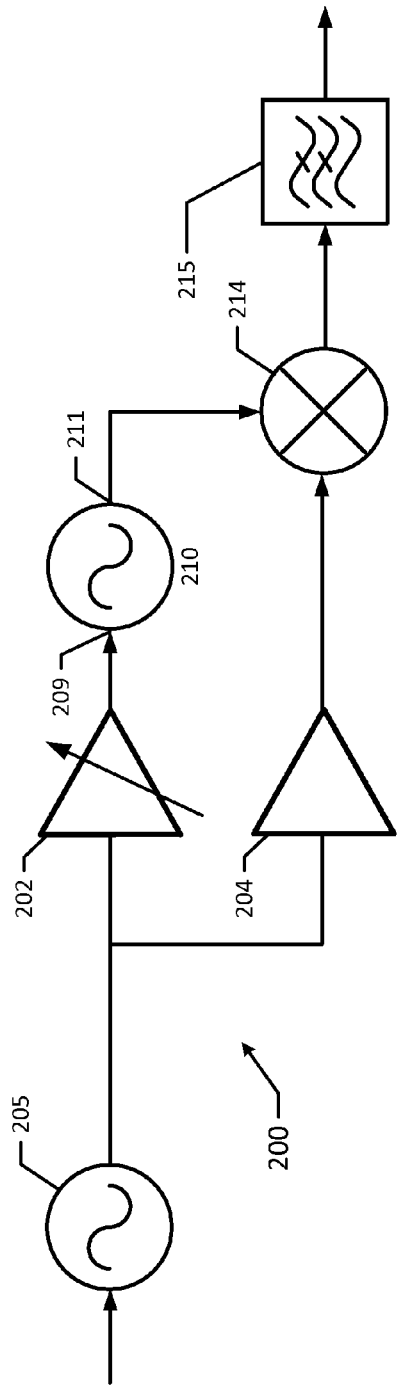
FIG. 1
FIG. 2

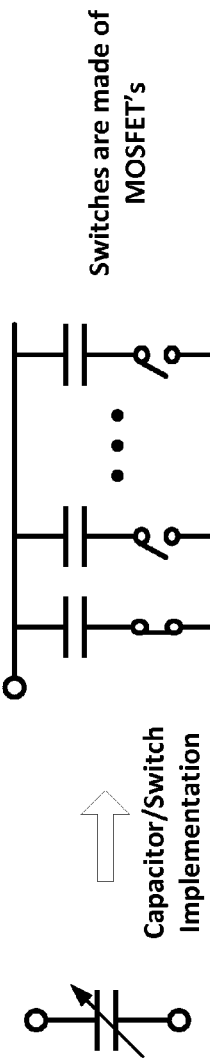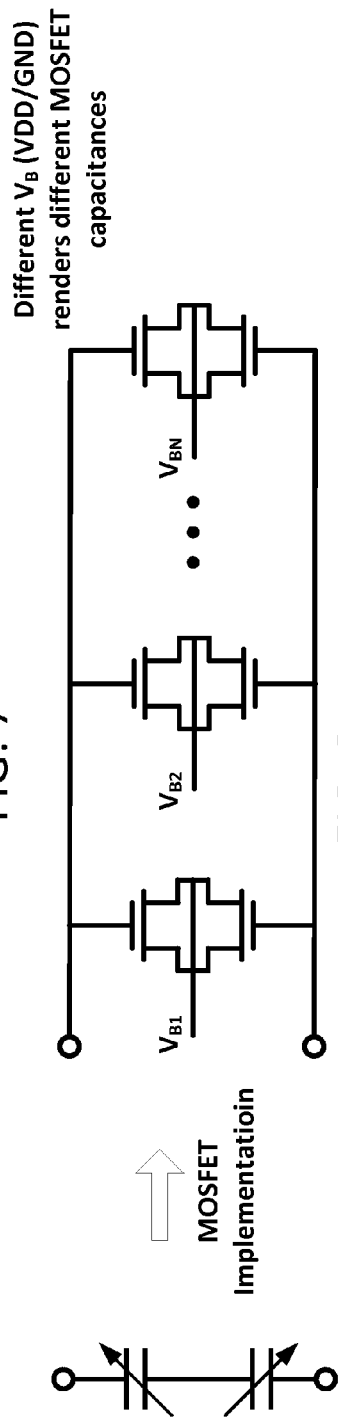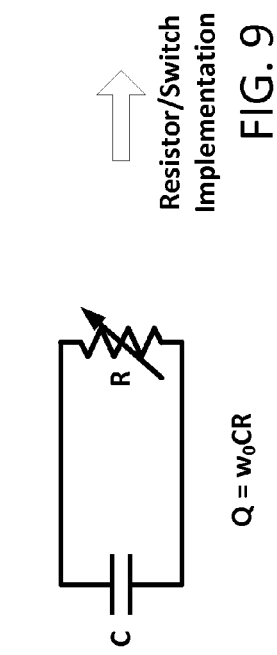

POLAR RECEIVER WITH ADJUSTABLE DELAY AND SIGNAL PROCESSING METHO

CROSS REFERENCE TO RELATED APPLICATIONS

This application is related to the following co-pending applications, all of which are incorporated herein by reference in their entirety:

U.S. application Ser. No. 13/840,478 filed Mar. 15, 2013, entitled POLAR RECEIVER ARCHITECTURE AND SIGNAL PROCESSING METHODS; U.S. application Ser. No. 13/839,557 filed Mar. 15, 2013, entitled POLAR RECEIVER SIGNAL PROCESSING APPARATUS AND METHODS; U.S. application Ser. No. 13/839,462 filed Mar. 15, 2013, entitled LNA WITH LINEARIZED GAIN OVER EXTENDED DYNAMIC RANGE; U.S. application Ser. No. 13/840,379 filed Mar. 15, 2013, entitled DIGITALLY CONTROLLED INJECTION LOCKED OSCILLATOR; and, U.S. application Ser. No. 13/842,470, filed Mar. 15, 2013, entitled SINGLE-BIT DIRECT MODULATION TRANSMITTER.

BACKGROUND OF THE INVENTION

Communications transceivers may utilize numerous architectures to recover data from a modulated carrier signal. These architectures include coherent demodulation, using either intermediate frequency conversion or direct-conversion receivers. Such receivers typically recover or regenerate the communications carrier signal using a phase-locked loop (PLL) and coherent demodulation. Recently, polar receiver architectures have been proposed that extract the modulation phase components from a received modulation signal without using a carrier recovery circuitry. However, the proposed polar receiver architectures and associated signal processing have deficiencies that result in poor performance and high bit error rates (BER). Accordingly, there is a need for improved polar receiver signal processing and architectures.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 1 is a block diagram of a polar receiver in accordance with some embodiments.

FIG. 2 is a block diagram of a polar receiver in accordance with some embodiments.

FIGS. 7 and 8 are circuit diagrams of adjustable capacitances in accordance with some embodiments.

FIG. 9 is a circuit diagram of an adjustable resistance in accordance with some embodiments.

Figure 3:
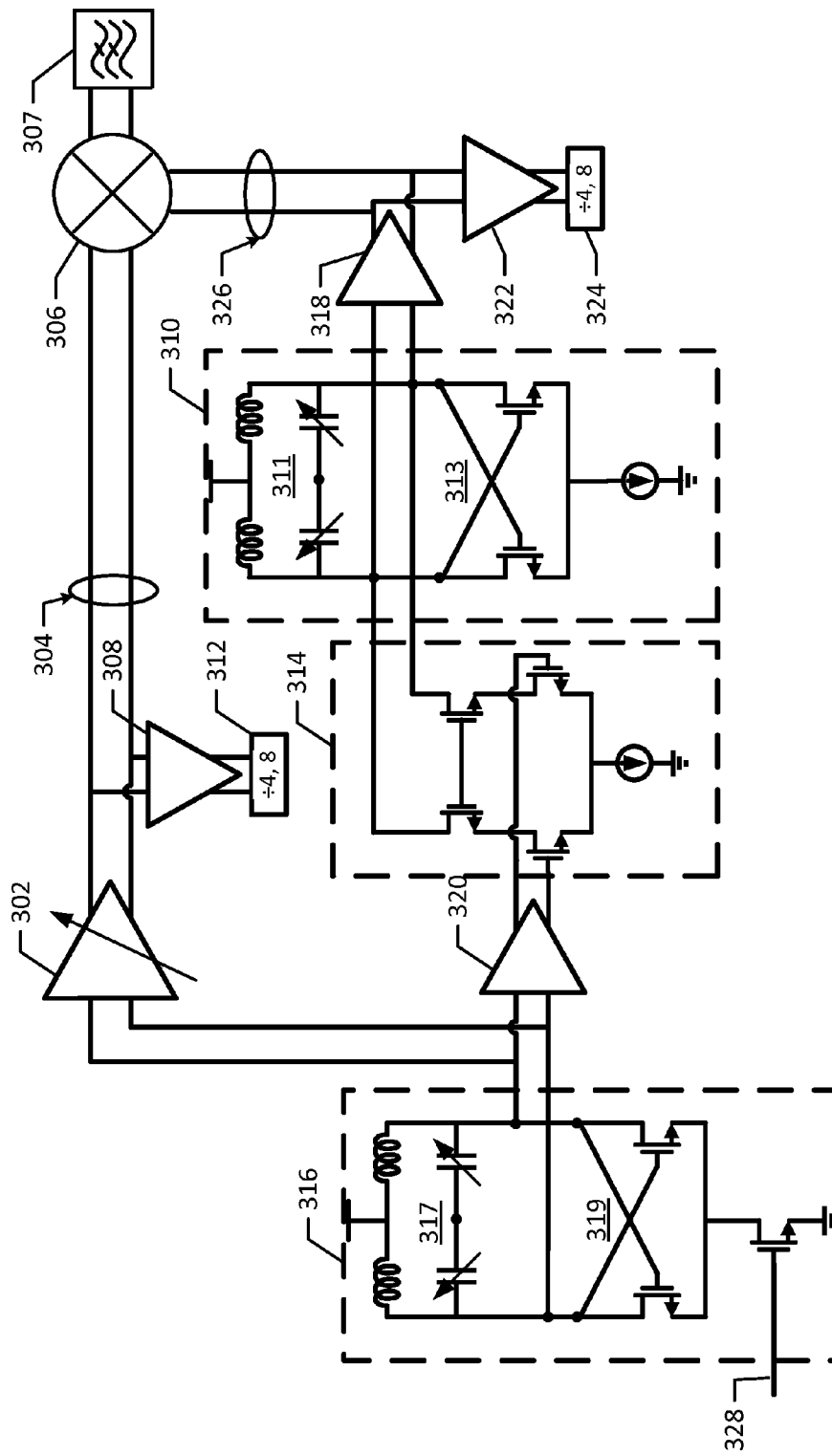
FIG. 3 is a circuit diagram of a polar receiver in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

With reference to FIG. 1, a block diagram of a polar receiver 100 will be described in accordance with some embodiments. A radio-frequency (RF) modulated injection signal $S_{inj}(t)$ 102 is applied to an input node 103 of an injection-locked frequency divider 104. The injection-locked frequency divider 104 may be a harmonic injection-locked oscillator (referred to herein as a harmonic ILO), such as a second-harmonic ILO.

The injection signal $S_{inj}(t)$ is a received modulated signal having a variable phase component. In some embodiments, the injection signal $S_{inj}(t)$ may be approximated as a sinusoidal wave having an angular frequency $2\omega_{inj}$ and a time-dependent phase offset $2\theta(t)$, such that $S_{inj}(t) \approx A_{inj} \cos(2\omega_{inj}t + 2\theta(t))$.

The harmonic ILO has an output node 105 at which an output signal $S_{out,1}(t)$ 106 is provided. The steady-state output of the harmonic ILO may be approximated as frequency-divided phase-shifted replica of the injection signal $S_{inj}(t)$. Specifically, $S_{out,1}(t) \approx A_{out,1} \cos(\omega_{inj}t + \theta(t) - \psi)$, where $\psi$ is a steady-state phase delay introduced by the harmonic ILO. Thus, the output signal $S_{out,1}(t)$ has a variable phase component $\theta(t)$, where the variable phase component $\theta(t)$ varies less than the variable phase component $2\theta(t)$ of the injection signal $S_{inj}(t)$. For example, a phase shift of 40° in the injection signal $S_{inj}(t)$ leads to phase shift of only 20° in the output signal $S_{out,1}(t)$. The variable phase component of the output signal $S_{out,1}(t)$ is referred to herein as having a compressed variable phase component.

The phase-compressed divided-frequency signal 106 is applied to an input node 109 of a fundamental injection-locked oscillator (ILO) 110 (also referred to herein as a fundamental ILO). Fundamental ILO 110 generates an output signal $S_{out,2}(t)$ 112 at output node 111, referred to herein as a phase-locking output signal. A change in the phase of the compressed variable-phase signal $S_{out,1}(t)$ leads, after a delay period, to a corresponding change in the phase of the output signal $S_{out,2}(t)$. That is, $S_{out,1}(t)$ and $S_{out,2}(t)$ are related by a time delay imposed by the fundamental ILO 110. The phase delay introduced by the fundamental ILO 110 can be described as having a steady-state value $\theta_S$ and a group delay $\tau_S$.

The difference between the output phase and the input phase of the fundamental ILO 110, as a function of time, can be expressed as $\theta(t)$. In the steady state, $\theta(t)$ is equal to $\theta_S$.

When there is a phase shift in the input signal, θ(t) temporarily deviates from $θ_s$. However, over the course of a characteristic time expressed herein as group delay $τ_S$, the difference between the output phase and input phase is restored to $θ_s$. The change in θ(t) back to the steady state value $θ_s$ can be described by the following equation:

$$\frac{d\theta(t)}{dt} = (\omega_r - w_{inj}) - \left(\frac{\omega_r \alpha}{2Q}\right) \frac{\sin[\theta(t)]}{\frac{4}{\pi} + \alpha \cos[\theta(t)]}$$

Figures 12, 13:
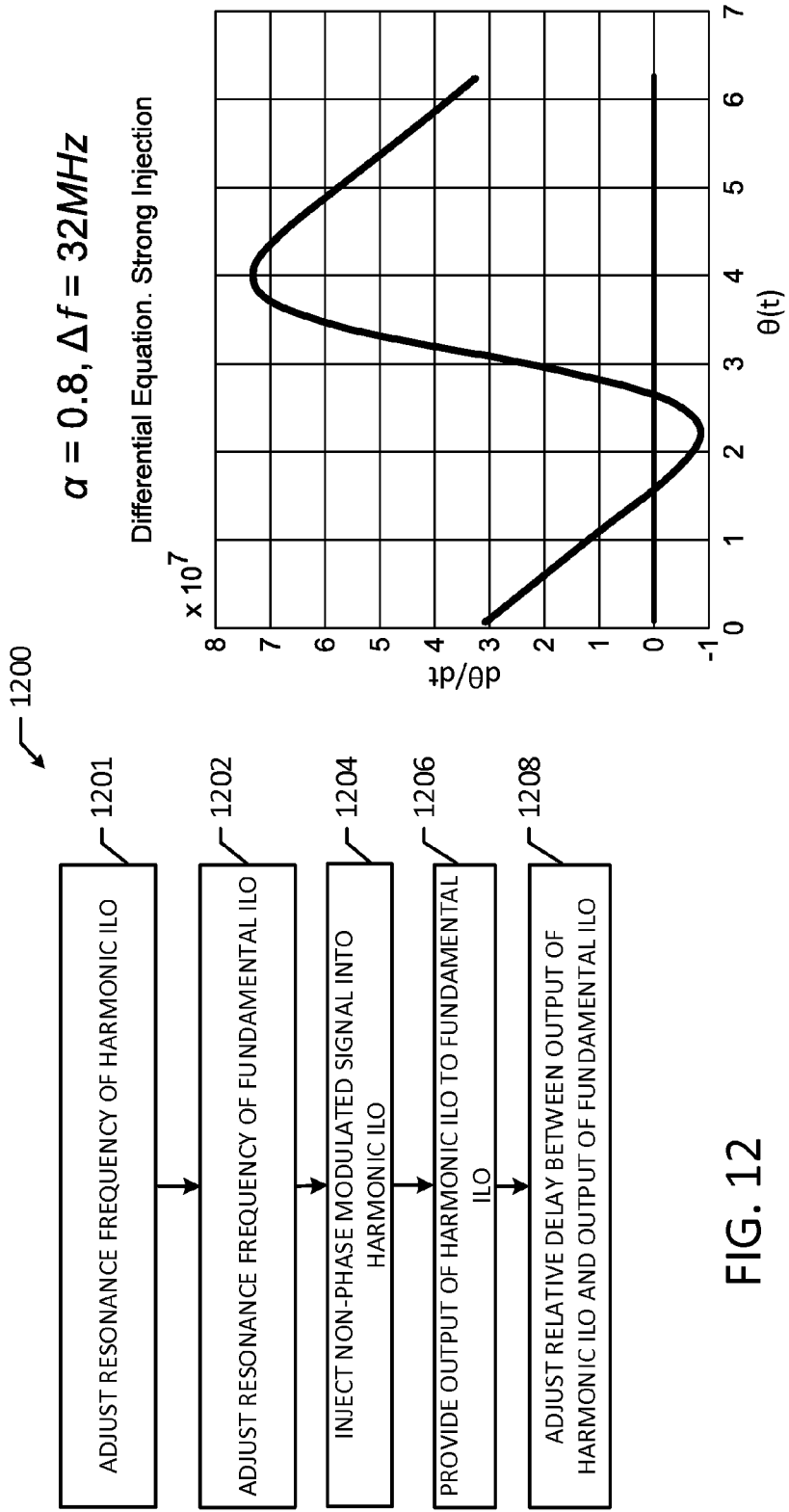
FIG. 12 is a flow chart depicting a method of operating a polar receiver in accordance with some embodiments.
FIG. 13 is a plot depicting solutions to the steady state phase offset associated with an ILO.

In this equation, $ω_r$ is the free-running angular frequency of the fundamental ILO, $ω_{inj}$ is the angular frequency of Sout,1(t), the signal injected into the ILO, a is the injection ratio, and Q is the quality factor of the fundamental ILO. The steady-state phase delay θs can be calculated as the value of θ at which dθ/dt is zero (that is, θ does not change) and d2θ/dt2 is negative (such that θs is a stable equilibrium). Solutions to this equation are shown in FIG. 13 by the zero crossing at 90°. Note that this solution is only an example demonstrating one set of parameter values for an example value of θs. In practice, a desired value for θs will depend on the particular circuit components and their inherent delay characteristics. In some embodiments, an ILO with a θs of approximately −52° has performed well. Thus, the steady-state phase delay θs can be adjusted by changing the free-running frequency of the ILO, the injection ratio of the ILO, or the quality factor Q of the ILO. It has been observed that a is inversely proportional to θs, while Q and Δf (i.e., $ω_r$−$ω_{inj}$) is directly proportional to θs. With these relationships the parameters may be adjusted in a desired direction while the effects are measured as described herein.

The receiver 100 is provided with a phase discriminator that, in at least one embodiment, includes a mixer 114. A first input to the mixer 114 is the phase-compressed divided-frequency signal $S_{out,1}$(t), and a second input the mixer is the phase-locking output signal $S_{out,2}$(t). The mixer 114 generates an output signal $m_2$(t) 116 representing the product of $S_{out,1}$(t) and $S_{out,2}$(t). The output $m_2$(t) of the mixer is provided to a low-pass filter 119 to remove double-frequency components present at the output of the mixer 114 and to provide a discriminator output signal Ω(t) 120.

When the inputs $S_{out,1}$(t) and $S_{out,2}$(t) to the mixer 114 maintain a steady-state phase difference of 90°, the output signal Ω(t) maintains a value close to zero. In some embodiments, the characteristics of the fundamental ILO 110 are adjustable to provide a value of $θ_S$ such that the inputs to mixer 114 have a steady-state phase difference of 90°. In some embodiments, the adjustable characteristics of the fundamental ILO 110 may include an adjustable injection ratio, an adjustable Q factor, and/or an adjustable free-running resonance frequency.

When the phase of injection signal $S_{inj}$(t) is shifted, for example due to modulation of the injection signal, the phase shift is replicated in the phase-compressed signal $S_{out,1}$(t) before it is replicated in the delayed phase-compressed signal $S_{out,2}$(t), resulting in a temporary deviation from the 90° steady-state phase difference between $S_{out,1}$(t) and $S_{out,2}$(t). This, in turn, leads to a nonzero value of the output signal Ω(t). When the phase shift in the injection signal $S_{inj}$(t) has propagated through to the delayed phase-compressed signal $S_{out,2}$(t) (i.e., the phase-locking output), the 90° steady-state phase difference between $S_{out,1}$(t) and $S_{out,2}$(t) is restored, and the output signal Ω(t) falls back to zero. Consequently, the output signal Ω(t) is representative of the time derivative of phase shifts in the injection signal $S_{inj}$(t). In alternative embodiments, a transmission delay line may be used to provide the group delay in place of the fundamental ILO 110.

Various techniques and components may be employed to adjust the properties of the receiver 100 such that the output signal Ω(t) maintains a value near zero in the absence of any phase variations in the injection signal $S_{inj}$(t). In some embodiments, the low-pass-filtered output of the mixer 114 may be measured in the absence of a phase-modulated signal at the input to the circuit 100. For example, a sinusoid at the carrier frequency may be injected to the harmonic ILO 104. The measured output may then be used to further adjust the characteristics of the fundamental ILO until the steady-state value of the output signal Ω(t) (also referred to as the DC component of the output signal) is reduced or substantially minimized. In one embodiment, the fundamental ILO may be adjusted until a local minimum of the output signal Ω(t) is achieved among a plurality of possible adjustment points. Such adjustments may be made to discrete values of capacitance, resistance, and/or inductance used in the fundamental ILO. In some embodiments, adjustments are made to the properties of the fundamental ILO until the steady-state value of the output signal Ω(t) falls below a threshold value. It is not necessary to test all possible configurations of the fundamental ILO in a search for an "absolute" minimum value of the DC component.

In embodiments that make use of a threshold value, the threshold may be set according to a symbol rate and a desired (or measured) signal to noise ratio (SNR) such that the integral (summation) over a symbol period of the DC value is of the same order of magnitude as the noise variance. Other techniques may be used to establish a threshold.

In some embodiments, the injection signal $S_{inj}$(t) 102 is also applied to an envelope detector 108 to generate an amplitude waveform A(t) 118.

Figure 4:
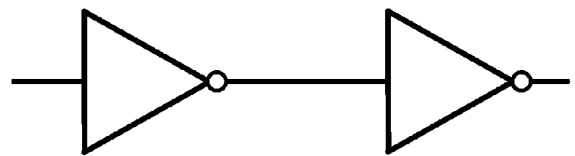
FIG. 4 is a block diagram of an amplitude limiting circuit in accordance with some embodiments.

With reference to FIG. 2, the receiver circuit 200 operates similarly to that of FIG. 1. An injection-locked frequency divider, such as a second-harmonic ILO 205, provides a phase-compressed divided-frequency signal. Using the phase-compressed divided-frequency signal, a fundamental ILO 210 provides a delayed phase-compressed signal. In the receiver 200, the phase-compressed divided-frequency signal is further processed by an amplitude limiter element 204 and by a variable delay element 202. The amplitude limiter element 204 is configured to generate a square-wave-type output by removing amplitude information from the signal input while preserving the phase information. That is, because phase information of the input signal is indicated by the zero crossings of the input signal, the input is used to toggle (or rapidly transition) the output between a high level voltage (e.g., $V_{dd}$) and a low level voltage (e.g., $V_{ss}$). The output signal therefore has less ambiguity regarding the phase information and reduces distortion that might otherwise be induced by the amplitude variations, referred to as amplitude-modulation to phase-modulation (AM to PM) distortion. The amplitude limiting circuit may be implemented using a pair of serially-connected CMOS inverters as shown in FIG. 4. The inverters may be configured to provide rapid switching by, for example, minimizing the input capacitance of the inverters and/or employing, in the inverters, transistors with low threshold voltages.

The variable delay element 202 can be operated to adjust the phase of the phase-compressed divided-frequency signal and thereby to adjust the relative phase between the two inputs to the mixer 214. The output of the mixer 214 is then filtered by a low-pass filter 215. Thus, adjustment of the variable delay element 202 can be used to achieve a steady-state discriminator output of near zero in the absence of a phase modulation on the input signal.

Another embodiment of a polar receiver is illustrated in FIG. 3. In receiver 300, the received modulated radio-frequency signal is input to a second-harmonic ILO 316 at injection node 328. The harmonic ILO output is a reduced-frequency phase-compressed signal as a result of the harmonic ILO. In the exemplary receiver 300, the harmonic ILO locks on to a frequency that is half of the frequency of the RF modulated signal input. That is, the frequency of the RF modulated signal input is the second harmonic of the phase-compressed divided-frequency output of the harmonic ILO 316. Correspondingly, phase shifts in the RF modulated signal input lead to phase shifts that appear in the phase-compressed divided-frequency signal but that are reduced in magnitude by a factor of two.

In some embodiments, the harmonic ILO 316 includes an LC tank circuit 317 driven by cross-coupled transistors 319. The LC tank circuit 317 locks on to a frequency whose second harmonic is equal to the frequency at the injection node 328. That is, the LC tank circuit 317 locks on to half of the frequency input at injection node 328.

Harmonic ILOs with harmonic factors other than two can also be used. In general, the harmonic ILO locks onto a lower harmonic of the input frequency, and its oscillations are at a lower frequency according to the harmonic factor (the second harmonic having a harmonic factor of one half such that the frequency of ILO oscillation is one half that of the input). A further aspect of the harmonic reduction in frequency is that phase variations of the input signal are also reduced by the harmonic factor. For a second-harmonic ILO such as harmonic ILO 316, a phase variation of 90° at the input of frequency $f_c$ results in a 45° phase change at the output frequency of $f_c/2$. For an $n^{th}$ harmonic ILO, a phase variation of 90° at the input of frequency $f_c$ results in a phase change of 90°/n at the output frequency of $f_c/n$. The output is therefore referred to as a phase-compressed divided-frequency signal.

In the receiver 300, the phase-compressed divided-frequency signal is then processed by two parallel signal paths. A first path includes an amplitude limiting circuit 320, a transconductance stage 314, a fundamental ILO circuit 310, and a buffer 318. A second signal path includes a variable delay element 302. The first and second paths are compared with a phase discriminator that, in the embodiment of FIG. 3, includes a mixer 306 and a low-pass filter 307. Note that in this embodiment, the phase delay element is in the signal path that does not include the fundamental ILO, as compared to FIG. 2 in which the phase delay element is in the same path as the fundamental ILO. These embodiments both are able to achieve a desired phase difference during a steady state condition. Thus, in some embodiments, an apparatus comprises: a harmonic ILO operative to receive an RF modulated signal input and to provide a phase-compressed divided-frequency signal output; a fundamental ILO operative to receive the phase-compressed divided-frequency signal output and to provide a phase-locking signal output; an adjustable delay circuit configured to adjust a relative phase difference between the phase-compressed divided-frequency signal and the phase-locking signal; a phase discriminator operative to receive the phase-compressed divided-frequency signal and the phase-locking signal and to provide a phase-detection output representative of a phase difference between the phase-compressed divided-frequency signal and the phase-locking signal. The embodiments may include (i) the adjustable delay circuit connected between the harmonic ILO and the phase discriminator and is operative to retard the phase of the phase-compressed divided-frequency signal or (ii) the adjustable delay circuit is connected between the harmonic ILO and fundamental ILO and is operative to retard the phase of the phase-locking signal.

As described above with respect to the amplitude limiter element 204 in FIG. 2, the amplitude limiting circuit 320 in FIG. 3 is configured to generate a square-wave-type output by removing amplitude information from the signal input while preserving the phase information, thereby reducing phase distortion due to amplitude changes. The transconductance stage 314 operates to convert a voltage output from the amplitude limiting circuit 320 to a current output that can, in turn, be supplied to the harmonic ILO 310. The harmonic ILO 310, includes an oscillating LC tank circuit 311 driven by a cross-coupled transistor pair 313. The oscillations of the LC tank circuit 311 lock on to the oscillating current signal from the transconductance stage 314 to provide an oscillating output voltage.

Variations and further details of ILOs are described more fully in co-pending U.S. application Ser. No. 13/840,379 filed Mar. 15, 2013, entitled DIGITALLY CONTROLLED INJECTION LOCKED OSCILLATOR.

The buffer 318 converts the oscillating output voltage from the harmonic ILO to an output current to be supplied to the mixer 306. In some embodiments, the mixer 306 may take a current as one input and a voltage as another input. The mixer has a first input node connected to the compressed output node and a second input node connected to the delayed-output node. The mixer may be, for example, a Gilbert cell, or other suitable signal frequency mixer. The mixer is configured to combine the phase-compressed signal and the delayed phase-compressed signal, and to output, at the mixer output node, a signal containing an estimated derivative of the variable phase component.

Generally, a mixer will provide at its output a signal having a frequency equal to the sum of the input signal frequencies and a signal at a frequency equal to the difference of the input signal frequencies. In the polar receiver architecture described herein, the sum frequencies are not of interest, so the receiver includes a filter configured to remove the higher-frequency components and to thus generate an estimated variable phase component signal from the estimated derivative of the variable phase component. To improve the characteristics of the estimated variable phase component from the mixer, the phase relationship between the two mixer inputs may be adjusted as described above by altering parameters of the fundamental ILO. The low-pass filtered output of the mixer may be monitored while the fundamental ILO is adjusted to determine a satisfactory operating point. In one embodiment, the ILO is injected with a steady-state signal (i.e., a carrier signal having no phase changes) and is adjusted until the mixer output has a reduced or otherwise acceptable DC offset.

To sample the frequencies processed by the receiver, receiver 300 may further include analog-to-digital circuitry 312, 324, such as successive approximation registers (SARs), which can be used to measure signal frequencies. For example, in the absence of an input signal at node 328, SAR 312 can be used to measure the free-running frequency of the harmonic ILO 316. Similarly, SAR 324 can be used to measure the free-running frequency of the fundamental ILO 310. The SARs 312, 324 are preferably isolated from the analog circuitry through respective buffers 308, 322.

When the inputs 304 and 326 to the mixer 306 are 90° out of phase, the DC component of the mixer output is substantially equal to zero. In embodiments in which the discriminator output is a low-pass filtered version of the output of the mixer 326, the discriminator output is substantially equal to zero.

Thus, under steady-state conditions (e.g., when the phase of the input is not modulated), the variable delay element 302 may be adjusted until a measured output of the discriminator is reduced, or brought as close to zero as is desired. Various circuit elements and signal processing blocks in either or both signal paths entering the discriminator (as well as the discriminator itself) may introduce delays that result in relative phase shifts between the signals traversing the two paths.

The variable delay element 302 may be implemented using a variety of techniques. For example, the delay element may be implemented with serially connected inverters with one or more of (i) a variable capacitance, (ii) a variable resistance, (iii) a variable bias current, or (iv) a variable supply voltage, as described below.

Figure 5:
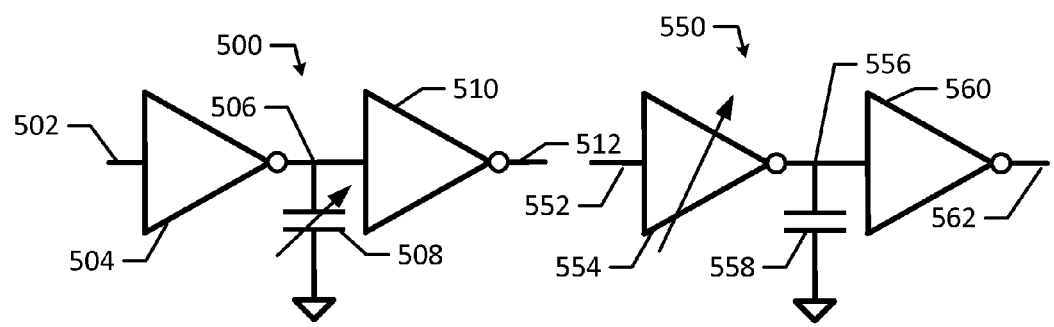
FIGS. 5, and 6 are block diagrams of an adjustable delay circuit in accordance with some embodiments.

An exemplary programmable delay circuit 500 is illustrated in FIG. 5. The delay circuit 500 includes a first-stage inverter 504 having an input 502. The output of the first-stage inverter 504 is coupled to node 506, which is in turn coupled to the input of a second-stage inverter 510. Node 506 is also coupled to ground through a variable capacitance 508.

When an input signal on input 502 switches from high to low, the output of first-stage inverter 504 switches from low to high. However, because of the capacitance 508, the voltage at node 506 is not initially sufficiently high to trigger the second-stage inverter 510 to output a low signal. Instead, the voltage at node 506 ramps upward as the capacitance 508 is charged by the output of the first-stage inverter 504. After a delay period, the voltage at node 506 becomes sufficiently high to trigger the second-stage inverter 510 to output a low signal at output 512. The delay period is determined by factors such as the value of the capacitance 508, the current output of the first-stage inverter 504, and the input capacitance and threshold voltage of the second-stage inverter 510. Because the capacitance 508 of the embodiment 500 of FIG. 5 is adjustable, the duration of the delay period can be programmed by changing the value of the variable capacitance 508.

When an input signal on input 502 switches from low to high, the output of first-stage inverter 504 switches from high to low. However, because of the capacitance 508, the voltage at node 506 is not initially sufficiently low to trigger the second-stage inverter 510 to output a high signal. Instead, the voltage at node 506 ramps downward as the capacitance 508 is discharged by the output of the first-stage inverter 504. After the delay period, the voltage at node 506 becomes sufficiently low to trigger the second-stage inverter 510 to output a high signal at output 512. Consequently, the signal provided at output 512 of the programmable delay circuit 500 is a delayed copy of the signal provided at the input 502, where the duration of the delay is programmable by changing the value of the variable capacitance 508.

Another exemplary programmable delay circuit 550 is illustrated in FIG. 5. The delay circuit 550 includes a first-stage inverter 554 having an input 552. The first-stage inverter 554 has a variable output current. The output of the variable first-stage inverter 554 is coupled to node 556, which is in turn coupled to the input of a second-stage inverter 560. Node 556 is also coupled to ground through a capacitance 558.

The programmable delay circuit 550 operates on principles similar to those of delay circuit 500, except that in the case of delay circuit 550, the capacitance is fixed, while the output current of the first-stage inverter is variable. When an input signal on input 552 switches from high to low, the output of the variable first-stage inverter 554 switches from low to high. The voltage at node 556 ramps upward as the capacitance 558 is charged by the output of the first-stage inverter 554. After a delay period, the voltage at node 556 becomes sufficiently high to trigger the second-stage inverter 560 to output a low signal at output 562. Thus, when an input signal on input 552 switches from high to low, the signal at output 562 also switches from high to low after the delay period. Conversely, when the input signal on input 552 switches from low to high, the signal at output 562 also switches from low to high after the delay period.

In the programmable delay circuit 550, the duration of the delay period is programmable by altering the current output of the inverter 554. A greater current output from the inverter 554 leads to faster charging and discharging of the capacitance 558 and thus leads to a shorter delay period. The variable output current of the first-stage inverter may be implemented using, among other techniques, a variable bias current flowing through the FETs of the inverter, which may also be modeled as a variable output resistance at the first-stage inverter 554.

In the embodiment 550 illustrated in FIG. 5, it is not necessary for the capacitance 558 to be explicitly added as a separate component. Instead, the capacitance 558 may represent the input capacitance of the second-stage inverter 560. The input capacitance of the second-stage inverter 560 may be sufficient to introduce a delay in the propagation of a signal through the circuit 550, and the duration of the delay can be adjusted by altering the variable output current of the first-stage inverter 554.

Figure 6:
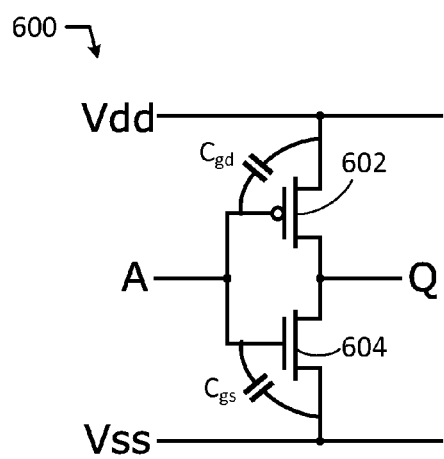

An exemplary CMOS inverter circuit 600 is illustrated in FIG. 6. When the input A is high, the resistance of PMOS transistor 602 is high, and the resistance of NMOS transistor 604 is low, so the voltage at the output Q is drawn down to $V_{ss}$. Conversely, when the input A is low, the resistance of NMOS transistor 604 is high, and the resistance of PMOS transistor 602 is low, so the voltage at the output Q is drawn up to $V_{dd}$. Some amount of delay may be introduced by the inherent gate-drain capacitance $C_{gd}$ of the PMOS transistor 602 and the inherent gate-source capacitance $C_{gs}$ of the NMOS transistor 604.

As described above with respect to FIG. 5, the duration of the delay in a programmable delay circuit may be adjusted by changing a variable capacitance. Exemplary embodiments of such a variable capacitance are illustrated in FIGS. 7 and 8. As illustrated in FIG. 7, the variable capacitance can be implemented by using a plurality of parallel capacitors that can be selectively activated with respective MOSFET switches. As illustrated in FIG. 8, the variable capacitance can be implemented by exploiting the gate-channel capacitance of one or more MOSFET devices, where the gate-channel capacitance is adjustable based on the value of $V_{B1}, V_{B2} \ldots V_{Bn}$.

As an alternative to the use of a purely capacitive junction, a programmable delay circuit may also employ one or more resistive elements, as illustrated in FIG. 9. Pursuant to the known properties of an RC circuit, the circuit introduces a low pass filtering effect which induces an exponential decay and ramp up, which can introduce a known delay in programmable delay circuits where the delay is adjustable by changing the value of the variable resistance.

In yet a further embodiment, the source voltage of the inverter chain may be adjusted, which in turn will affect the current flow and consequently the rate at which the capacitance is charged and discharged. It is understood that other mechanisms and circuits may be employed to provide an adjustable phase offset consistent with the circuits described herein.

One aspect of injection locking oscillators is referred to as a metastable state. The metastable state may result in the phenomenon that, when a phase change of the input signal occurs, the ILO may regain its locked condition by adjusting the phase of its output in a direction opposite to the input phase change until the steady state condition is achieved. For example, when an input signal to a fundamental ILO advances by 90°, the output signal of the ILO may also advance its phase by 90°. However, under metastable conditions, the ILO may, instead of advancing its phase by 90°, actually retard its phase by 270°. Such conditions of metastability can introduce errors in reading phase modulations. Such errors are more likely to be introduced when the phase change of the input is large enough so that the input-output ILO phase difference is greater than a phase difference associated with the metastable state. Because the metastable state is more likely to impart erroneous frequency or phase changes in the ILO output when the input phase change is larger, the phase compression obtained from the use of an injection-locked frequency divider, such as a second-harmonic ILO as an initial stage in the polar receiver significantly reduces errors and improves performance of the receiver.

In some embodiments, the second-harmonic ILO and the fundamental ILO may be adjustable to obtain the desired characteristics or performance of the polar receiver. For example, the second-harmonic ILO may be adjusted to select a desired signal having a predetermined carrier frequency. The adjustment to the ILO may be to change the free-running frequency $f_r$ of the second-harmonic ILO, such as by altering a capacitance in the ILO tank circuit 317.

A polar receiver may include an ILO control circuit 1000 configured to measure a free running frequency $f_r$ of the ILO after removing the injection input signal, such as by controlling a switch. The ILO control circuit may adjust a capacitance of the tank circuit until the free running frequency $f_r$ has a desired relationship to the carrier signal $f_c$ (or channel center frequency). The desired relationship may be that $f_r$ is offset from $f_c/2$. The ILO control circuit may also adjust one or more parameters of the second-harmonic ILO, including an ILO injection coefficient α, a quality factor Q, and a capacitance of a tank circuit to adjust the free running frequency $f_r$.

The ILO control circuit may also be configured to adjust one or more parameters of the fundamental ILO to adjust an amount of delay associated with the delayed phase-compressed signal. The delay may be adjusted by adjusting one or more parameters, including an injection coefficient α, a quality factor Q, and a free running frequency $f_r$. The injection coefficient may be adjusted by altering a transconductance stage at the ILO input, or by adding or removing parallel-configured signal injection node devices, or by altering bias signals within the ILO. The quality factor may be adjusted by altering a resistance value within the tank circuit. The free running frequency may be adjusted by altering a capacitance of the ILO tank circuit such as by a capacitor bank or varactor. In a further embodiment, the fundamental ILO may be configured to operate in a strong injection mode, as opposed to weak injection mode. Weak injection may be characterized by a low injection ratio, such as 0.1 (i.e., 10%). Strong injection may therefore include a range of injection coefficients α>0.1. In a further embodiment, the strong injection mode may include a range of injection coefficients α>0.5.

Figure 10:
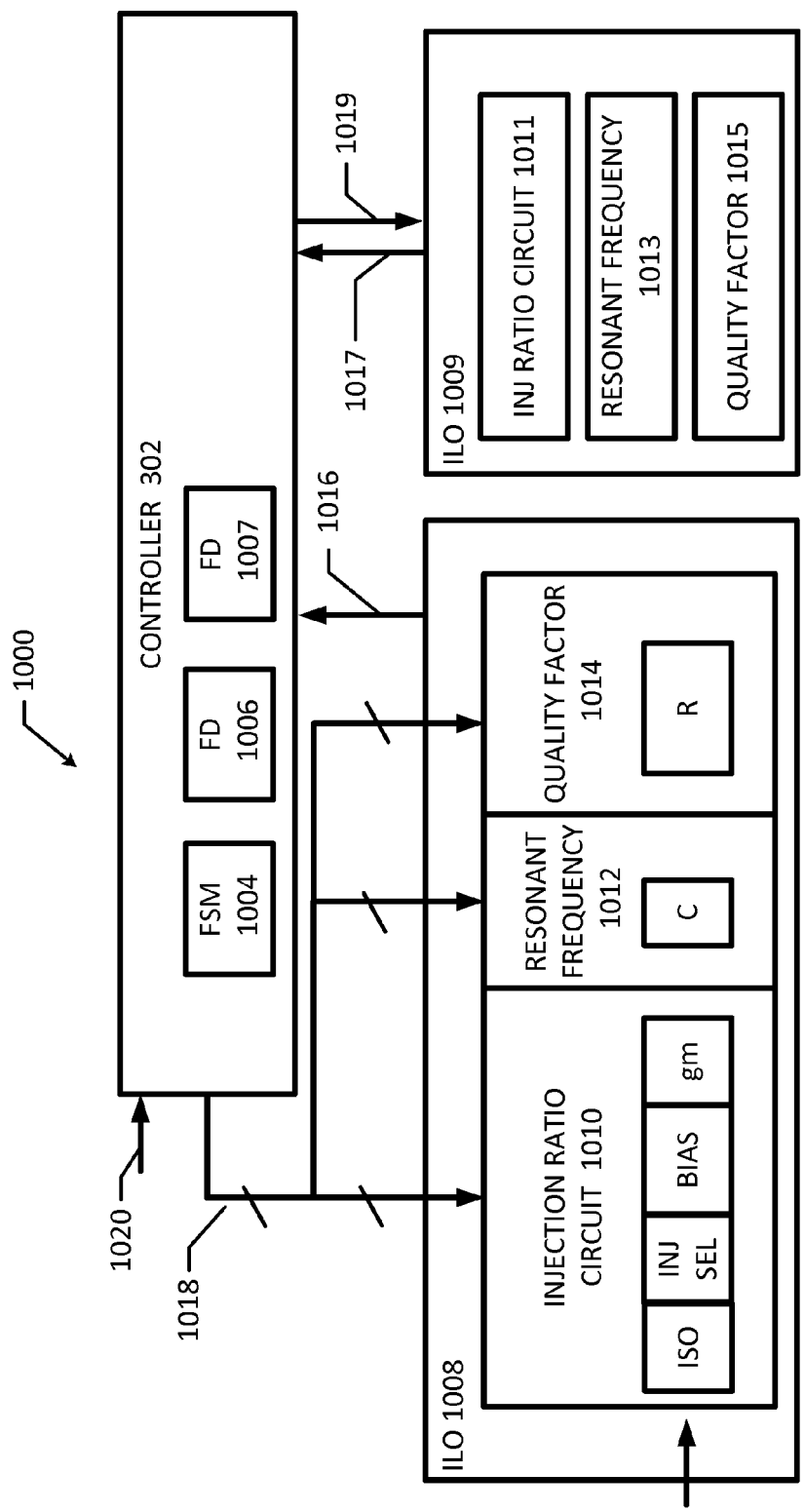
FIG. 10 is a block diagram of an injection-locked oscillator control circuit in accordance with some embodiments.

In FIG. 10, an embodiment of a controllable ILO circuit 1000 is illustrated. The controllable ILO circuit includes an ILO controller 1002 and two ILO circuits 1008, 1109, which may include a harmonic ILO and a fundamental ILO. The ILO controller 1002 may include a finite state machine 1004, and frequency detectors 1006, 1007 to detect the frequencies of respective ILOs 1008, 1009. The frequency detectors may comprise configurable counters so as to alter the characteristics of the control loop to attain different frequencies.

The ILO controller 1002 may be configured to provide a control output signal on control output lines 1018, 1019 to respective ILOs 1008, 1009. The control outputs may include multiple parallel bits for controlling, in ILO 1008, each of an injection ratio circuit 1010, a resonant frequency circuit 1012, and a quality factor adjustment circuit 1014. The injection ratio circuit 1010 may include an adjustable bias (BIAS) and/or and adjustable transconductance amplifier stage (gm) to control the injection ratio, an injection selection circuit (INJ SEL) to configure the ILO as a fundamental or harmonic ILO, as well as an isolation circuit (ISO) to remove or otherwise isolate the injection signal from the input of the ILO 1008. The resonant frequency circuit 1012 may include variable capacitors (C) such as a capacitor bank. The quality factor circuit 1014 may include a variable resistor (R) such as a resistor bank. The output of the ILO 1008 is applied to the ILO controller 1002 over signaling line 1016.

Similarly, the control output 1019 may include multiple parallel bits for controlling, in ILO 1009, each of an injection ratio circuit 1011, a resonant frequency circuit 1013, and a quality factor adjustment circuit 1015. The injection ratio circuit 1011 may include an adjustable bias and/or and adjustable transconductance amplifier stage to control the injection ratio, an injection selection circuit to configure the ILO 1009 as a fundamental or harmonic ILO, as well as an isolation circuit to remove or otherwise isolate the injection signal from the input of the ILO 1009. The resonant frequency circuit 1013 may include variable capacitors, such as a capacitor bank. The quality factor circuit 1015 may include a variable resistor, such as a resistor bank. The output of the ILO 1009 is applied to the ILO controller 1002 over signaling line 1017.

In some embodiments the ILO controller 1002 may use the frequency detectors 1006, 1007, to determine a free running frequency of the ILOs. The ILO controller may responsively adjust the free running frequencies, such as by altering a capacitance in a tank circuit of the appropriate ILO.

In some embodiments, the ILO controller 1002 may receive an input from the output of a mixer, or a low pass filtered version of the mixer output over the input line 1020. In one embodiment, the signal on line 1020 is monitored for a DC offset component, which is used as a performance metric for adjusting parameters of the ILOs 1008, 1009. In one embodiment, the presence of a DC component may indicate the need to adjust parameters of the ILO 1008 in order to obtain a desired phase difference between an input of the ILO 1008 and the output of the ILO 1008. In this embodiment, the mixer inputs are connected to the input and output of ILO 1008.

Figure 11:
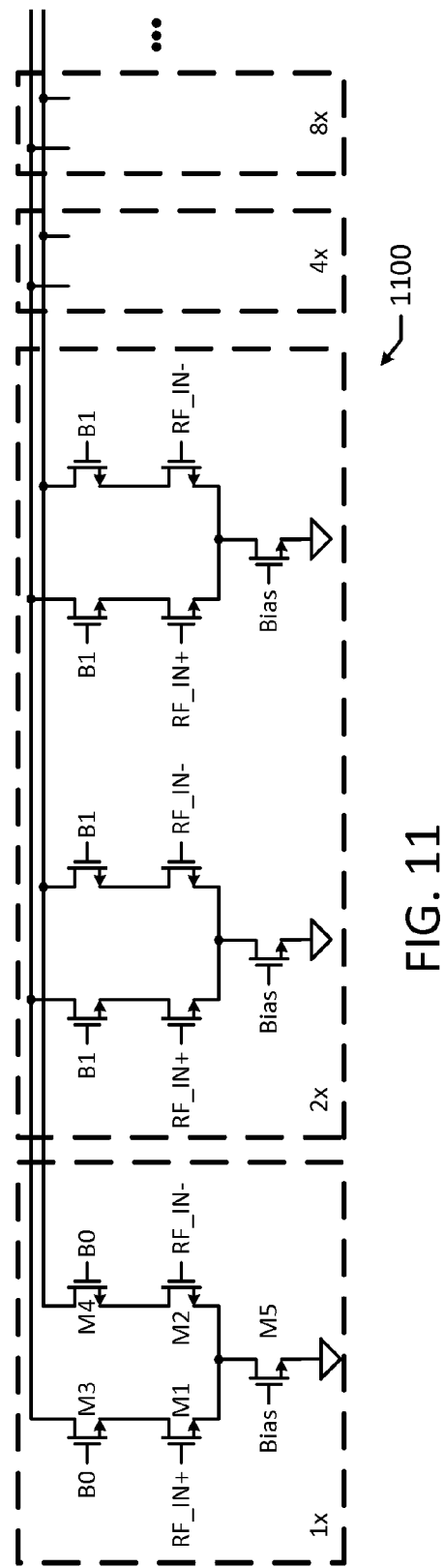
FIG. 11 is an adjustable transconductance circuit in accordance with some embodiments.

A variable transconductance circuit 1100 that can be used to adjust the injection ratio of an ILO, such as a fundamental ILO, is illustrated in FIG. 11. The control signal from the ILO controller 1102 may include numerous bits B0, B1, B2 etc. Control bit B0 may be used to control a first cell, control bit B1 may be used to control a second cell, and control bit B2 may be used to control a third cell. Note that the first second and third cells each provide an increasing amount of transconductance amplification. The code may be referred to as a binary code in that each bit controls an amplification of twice the prior stage. In an alternative embodiment, each cell may add the same amount of gain, in which case the binary control word may be referred to as a thermometer code.

The characteristics of both the second-harmonic ILO and fundamental ILO, including Q, $f_r$, and α may be adjusted according to other structures and methods, such as those described in co-pending U.S. application Ser. No. 13/840,379, filed Mar. 15, 2013, entitled DIGITALLY CONTROLLED INJECTION LOCKED OSCILLATOR.

In the polar receiver architecture, some embodiments are configured to receive modulated signals having amplitude, or signal envelope variations. Note that the second-harmonic ILO may be configured to generate a phase-compressed signal having substantially reduced amplitude variations relative to the received modulated signal. The envelope being of more constant magnitude will result in less amplitude-induce phase distortion in the output of the fundamental ILO.

In some embodiments, the polar received may include an amplitude detector configured to process the received modulated signal and to output a magnitude signal representative of the magnitude of the received modulated signal. In this way, the envelope of the signal may be preserved, and later re-combined with the estimated phase signal.

The polar receiver may also include a polar demodulation circuit configured to recover data information from the estimated variable phase component signal. In an embodiment, the demodulation circuit may be configured to first convert the polar information (amplitude and phase signals) into more conventional in-phase and quadrature signal components, commonly referred to as I and Q signals. These conventional IQ signals may then be processed using well-developed signal processing techniques and architectures, which need not be reiterated herein.

Now, with reference to the flow chart of FIG. 12, an exemplary method of operating a polar receiver is described. In the method 1200, the polar receiver is tuned to a particular frequency by adjusting the resonance frequency of a harmonic ILO in step 1201. The resonance frequency of a fundamental ILO is adjusted in step 1202 to change the free-running frequency of the fundamental ILO. In step 1204, a non-phase modulated signal is injected into a second-harmonic ILO, and in step 1206, the divided-frequency output of the second-harmonic ILO is connected to the input of the fundamental ILO. In step 1208, a relative delay is adjusted between the output of the harmonic ILO and the output of the fundamental ILO.

The method may also include adjusting one or more parameters of the second-harmonic ILO, such as the injection coefficient, a quality factor, and a resonance frequency of the ILO. In some embodiments, a phase measurement is taken to determine a phase relationship between the output of the second-harmonic ILO and the output of the fundamental ILO. In such an embodiment, the adjustment of the relative delay in step 1208 is performed in response to the phase measurement. This phase measurement may be obtained from a phase discriminator.

The adjustment of the relative delay in step 1208 may be performed by, for example, altering a bias current of an inverter within the delay circuit or by altering a variable capacitance of a serially-connected inverter circuit within the delay circuit. In some embodiments, the method of operating a polar receiver further includes re-adjusting at least one parameter of the fundamental ILO after adjusting the relative delay with the delay circuit.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus comprising:
a harmonic injection-locked oscillator (ILO) having an RF modulated signal input and a phase-compressed divided-frequency output;
a fundamental ILO connected to the phase-compressed divided-frequency output and a phase-locking output;
an adjustable delay circuit connected to the phase-compressed divided-frequency output and a having a delay output;
a phase discriminator connected to the delay output and to the phase-locking output, and having a phase-detection output representative of a phase difference between signals on the delay output and the phase-locking output.

2. The apparatus of claim 1 wherein the adjustable delay circuit comprises serially-connected inverter circuits.

3. The apparatus of claim 2 wherein the serially-connected inverter circuits comprises a first inverter circuit having a variable current output.

4. The apparatus of claim 3 wherein the variable output current is controlled by adjusting a bias current in the first inverter circuit.

5. The apparatus of claim 3 wherein the variable current output is used to charge and discharge a gate-source capacitance of a second inverter circuit of the serially-connected inverter circuits.

6. The apparatus of claim 2 wherein the serially-connected inverter circuits comprises a variable capacitance interposed between a first inverter circuit and a second inverter circuit.

7. The apparatus of claim 6 wherein the variable capacitance comprises a switched capacitor bank.

8. The apparatus of claim 1 further comprising a control circuit configured to adjust the adjustable delay circuit in response to a measurement of the phase-detection output.

9. The apparatus of claim 1 wherein the phase discriminator is a mixer and low-pass filter.

10. A method comprising:
adjusting a resonance frequency of a fundamental injection-locked oscillator (ILO) to change the free-running frequency of the fundamental ILO;
injecting a non-phase modulated signal into a second-harmonic ILO and connecting an output of the second-harmonic ILO to the fundamental ILO; and
adjusting a relative delay between the output of the second-harmonic ILO and an output of the fundamental ILO using a delay circuit.

11. The method of claim 10 further comprising adjusting one or more parameters of the second-harmonic ILO wherein the one or more parameters include a parameter selected from the group consisting of an injection coefficient, a quality factor, and a resonance frequency of the ILO.

12. The method of claim 10 further comprising obtaining a phase measurement of a phase relationship between the output of the second-harmonic ILO and the output of the fundamental ILO, and wherein the relative delay is adjusted in response to the phase measurement.

13. The method of claim 12 wherein the phase measurement is obtained from a phase discriminator.

14. The method of claim 10 wherein the relative delay is adjusted by altering a bias current of an inverter within the delay circuit.

15. The method of claim 10 wherein the relative delay is adjusted by altering a variable capacitance of a serially-connected inverter circuit within the delay circuit.

16. The method of claim 10 further comprising re-adjusting at least one parameter of the fundamental ILO after adjusting the relative delay with the delay circuit.

17. The method of claim 10 further comprising adjusting a resonance frequency of the second harmonic ILO to change the free-running frequency of the second harmonic ILO.

18. An apparatus comprising:
a harmonic injection-locked oscillator (ILO) operative to receive an RF modulated signal input and to provide a phase-compressed divided-frequency signal output;
a fundamental ILO operative to receive the phase-compressed divided-frequency signal output and to provide a phase-locking signal output;
an adjustable delay circuit configured to adjust a relative phase difference between the phase-compressed divided-frequency signal and the phase-locking signal; a phase discriminator operative to receive the phase-compressed divided-frequency signal and the phase-locking signal and to provide a phase-detection output representative of a phase difference between the phase-compressed divided-frequency signal and the phase-locking signal.

19. The apparatus of claim 18, wherein the adjustable delay circuit is connected between the harmonic ILO and the phase discriminator and is operative to retard the phase of the phase-compressed divided-frequency signal.

20. The apparatus of claim 18, wherein the adjustable delay circuit is connected between the harmonic ILO and fundamental ILO and is operative to retard the phase of the phase-locking signal.

* * * * *

UNITED STATES PATENT AND TRADEMARK OFFICE
CERTIFICATE OF CORRECTION

| | | |
|---|---|---|
| PATENT NO. | : 9,083,588 B1 | Page 1 of 1 |
| APPLICATION NO. | : 14/260021 | |
| DATED | : July 14, 2015 | |
| INVENTOR(S) | : Yang Xu et al. | |

It is certified that error appears in the above-identified patent and that said Letters Patent is hereby corrected as shown below:

On the Title Page, Item (54) and in the Specification, Column 1

Correct the Title as follows:

Change "POLAR RECEIVER WITH ADJUSTABLE DELAY AND SIGNAL PROCESSING METHO" with --POLAR RECEIVER WITH ADJUSTABLE DELAY AND SIGNAL PROCESSING METHODS--.

Signed and Sealed this
Twenty-fourth Day of November, 2015

Michelle K. Lee
*Director of the United States Patent and Trademark Office*